US00RE40676E

(19) United States
(12) Reissued Patent
Holzapfel et al.

(10) Patent Number: US RE40,676 E
(45) Date of Reissued Patent: Mar. 24, 2009

(54) SCANNER UNIT FOR AN OPTICAL POSITION MEASURING DEVICE

(75) Inventors: Wolfgang Holzapfel, Obing (DE); Elmar Mayer, Nuβdorf (DE); Siegfried Reichhuber, Stein/Traun (DE)

(73) Assignee: Dr. Johannes Heidenhain GmbH, Traunreut (DE)

(21) Appl. No.: 11/057,106

(22) Filed: Feb. 11, 2005

Related U.S. Patent Documents

Reissue of:
(64) Patent No.: 6,519,044
Issued: Feb. 11, 2003
Appl. No.: 09/251,066
Filed: Feb. 18, 1999

(51) Int. Cl.
*G02B 11/14* (2006.01)
*H01J 5/16* (2006.01)

(52) U.S. Cl. ..... 356/616; 356/630; 356/634; 250/237

(58) Field of Classification Search ..... 356/616; 250/237; 257/433
See application file for complete search history.

(56) References Cited

U.S. PATENT DOCUMENTS

| | | | | |
|---|---|---|---|---|
| 3,205,364 A | | 9/1965 | Pong et al. | |
| 3,935,501 A | * | 1/1976 | Sterbal | 313/499 |
| 4,703,176 A | | 10/1987 | Hahn et al. | |
| 4,818,099 A | * | 4/1989 | Preikschat et al. | 356/5.05 |
| 4,840,488 A | | 6/1989 | Kabaya et al. | |
| 5,251,066 A | | 10/1993 | Appelbaum | |
| 5,648,658 A | | 7/1997 | Holzapfel | |
| 5,670,781 A | | 9/1997 | Sebacken | |
| 5,995,229 A | | 11/1999 | Omi | |
| 6,475,824 B1 | * | 11/2002 | Kim | 438/66 |
| 6,519,044 B1 | | 2/2003 | Holzapfel | |

FOREIGN PATENT DOCUMENTS

| | | |
|---|---|---|
| DE | 296 09 523 | 11/1997 |
| DE | 19855307 | 8/1999 |
| EP | 0 577 088 | 1/1994 |
| GB | 2194635 | 3/1988 |
| JP | 9-189514 | 7/1997 |

OTHER PUBLICATIONS

Copy of photograph of "IC–OE" product of iC–Haus GmbH, marked as "Enclosure A" Oct./Nov. 1997.
Invoice dated Jul. 14, 1997 of iC–Haus GmbH to Max Stegmann GmbH, marked as "Enclosure B" (English–language translation provided).

(Continued)

*Primary Examiner*—Rebecca C Slomski
(74) *Attorney, Agent, or Firm*—Kenyon & Kenyon LLP

(57) ABSTRACT

A scanning unit for an optical position measuring device, which is suited for optically scanning a scale graduation, to produce positionally dependent scanning signals on the basis of scale graduation. The scanning unit includes a carrier element, at least one optoelectronic component, which is arranged on the carrier element, a radiation-sensitive or a radiation-emitting surface region of the component being oriented to face away from the carrier element. Provision is also made for at least one electrically conductive connector lead between the carrier element and a contacting region of the component. An at least semi-transparent cover element is arranged directly on the radiation-sensitive and/or radiation-emitting surface region of the component. In this case, the cover element is arranged in such a way with respect to the component that the contacting region of the component is not covered by it and, in addition, the thickness of the cover element is selected so as to ensure that the top side of the cover element exceeds the height of the connector lead in the contacting region.

61 Claims, 3 Drawing Sheets

OTHER PUBLICATIONS

"Eidesstattliche Versicherung" ("Affirmation in Lieu of Oath") of Dr. Heiner Flocke, dated Jun. 15, 2006, marked as "Enclosure C" (English–language translation provided).

"Strukturestueckliste" ("Structure Bill of Materials") for SCM 70 encoder of Max Stegmann GmbH, marked as "Enclosure D" (English–language translation provided) Nov. 20, 1997.

"Eidesstatliche Versicherung" ("Affirmation in Lieu of Oath")of Josef Siraky, dated Jun. 20, 2006, marked as "Enclosure E" (English–language translation provided).

Invoice dated Jan. 23, 1998 of Max Stegmann GmbH to Indramat GmbH, marked as "Enclosure F" (English–language translation provided).

Dip. Ing. Martin Dachroth, "Mini Disc (MiDi) Technology in Focus: Optical MiDi Encoder with Centric Scanning," *Sick/Stegmann* Nov. 2004.

T. Matoba et al., "Photosensor Array for Optical Encoder", *Electronics and Communications in Japan, Part II, Electronics*, Bd. 75, Nr. 1, Jan. 1992, pp. 56–63.

Examination Report dated Dec. 9, 2004, German Patent and Trademark Office, German Application No. 198 55 307.2.

* cited by examiner

SCANNER UNIT FOR AN OPTICAL POSITION MEASURING DEVICE

Matter enclosed in heavy brackets [ ] appears in the original patent but forms no part of this reissue specification; matter printed in italics indicates the additions made by reissue.

FIELD OF THE INVENTION

The present invention is related to a scanning unit for an optical position measuring device.

RELATED TECHNOLOGY

Known optical position measuring devices include a scanning unit which is movable in relation to a graduation scale and which is used to produce positionally dependent scanning signals. For this, a plurality of optoelectronic components, such as light sources, designed as LEDs, and detector elements, designed as photoelements, are generally configured on the scanning unit side. In this context, scanning signals, which are modulated as a function of displacement, are produced via the photoelements when the graduation of the scale is scanned. As a general rule, the photoelements are arranged on carrier elements, for example boards or printed-circuit boards designed for this purpose. The radiation-sensitive surface regions of the photoelements are oriented to face away from the carrier member. Connector leads, or bonding wires, which must be placed between the carrier element and the contacting regions of the photoelements, are used for the contacting of the photoelements. As in the case of the radiation-sensitive surface regions, the contacting regions are arranged on the side of the photoelements that faces away from the carrier element. The connector leads constituted as bonding wires must be reliably protected to ensure that no damage is caused during the measuring operation by any scale movement in relation to the scanning unit. A problem however arises especially when the optical scanning principle selected for the particular case stipulates a very small distance between the optoelectronic components and the scale that is scanned by these components.

Therefore, to protect the connector leads, the European Patent No. 0 577 088 A2 proposes arranging the photoelements on the carrier member, subsequently contacting these elements using bonding wires, and thus applying a suitable transparent encapsulating material over the contacting regions and the radiation-sensitive surface regions of the photoelements. As a last step, the surface of the encapsulating material is patterned to produce the required scanning graduation. If, however, the optical scanning principle selected in the particular case requires a smallest possible distance between the radiation-sensitive surface regions of the components and the scanning graduation, then the arrangement proposed by European Patent No. 0 577 088 A2 is unsuitable. Furthermore, an arrangement of this kind requires graduation of the transparent encapsulant, and this cannot be done with the same precision as can, for instance, graduation of a separate glass scanning plate.

Equally unsuited for this kind of requirement for a small distance between the radiation-sensitive surface regions and the scanning graduation is an arrangement disclosed in U.S. Pat. No. 4,703,176. It proposes placing a scanning plate having a suitable scanning graduation at a finite distance above a plurality of optoelectronic detector elements. In this context, the scanning plate extends with its surface over the entire area of the detector elements, inclusive of the corresponding, adjacent contacting regions. The bonding wires for contacting the detector elements are protected from mechanical damage in this case by the scanning plate disposed above them. However, the distance provided between the radiation-sensitive surface regions and the scanning graduation is, again, too large for certain- optical scanning principles in particular when a compact type of construction is needed.

It is furthermore known from Japanese Patent Document No. 09-189514 to arrange a transparent glass plate over a graduated detector arrangement of a scanning unit, the glass plate being arranged and dimensionally sized to protect the bonding wires required for the contacting from mechanical damage during a measuring operation. What is problematic in this case is that the detector elements in this kind of scanning unit design already include the scanning graduation, so the result is less flexibility when designing the corresponding position measuring devices.

Fundamentally similar problems result when it is required to arrange other optoelectronic components, such as light sources having radiation-emitting surface regions, in conjunction with prearranged transmitting graduations in a compact scanning unit of an optical position measuring system.

SUMMARY OF THE INVENTION

An object of the present invention is to devise a scanning unit for an optical position measuring device, which is able to provide reliable protection from mechanical damage to connector leads even with a required small distance between the radiation-sensitive or radiation-emitting surface regions of optoelectronic components.

The present invention provides a scanning unit for an optical position measuring device, suited for optically scanning a scale graduation structure (10), to produce positionally dependent scanning signals on the basis of the scale graduation, comprising:

a) a carrier element (2; 21; 31)

b) at least one optoelectronic component (3a, 3b, 3c, 3d; 23a, 23b.1 23b.2, 23b.3, 23b.4, 23c; 33c, 33d), which is arranged on carrier element (2; 21; 31), a radiation-sensitive or a radiation-emitting surface region of the component (3a, 3b, 3c, 3d; 23a, 23b.1 23b.2, 23b.3, 23b.4, 23c; 33c, 33d) being oriented to face away from the carrier element (2; 21; 31);

c) at least one electrically conductive connector lead (6a, 6b, 6c, 6d; 26a–26i; 36c, 36d) between the carrier element (2; 21; 31) and a contacting region (5a, 5b, 5c, 5d; 25a–25i; 35c, 35d) of the component (3a, 3b, 3c, 3d; 23a, 23b.1 23b.2, 23b.3, 23b.4, 23c; 33c, 33d); and d) an at least semi-transparent cover element (4; 24; 34), which d1) at least in subregions has a graduation (7a, 7b, 7c, 7d;

27; 37c, 37d); and which d2) is arranged directly on the radiation-sensitive and/or radiation-emitting surface region of the component (3a, 3b, 3c, 3d; 23a, 23b.1 23b.2, 23b.3, 23b.4, 23c; 33c, 33d) in such a way that the contacting region (5a, 5b, 5c, 5d; 25a–25i; 35c, 35d) of the component (3a, 3b, 3c, 3d; 23a, 23b.1 23b.2, 23b.3, 23b.4, 23c; 33c, 33d) is not covered by it; and d3) the thickness of the cover element (4; 24; 34) is selected so as to ensure that the top side of the cover element (4; 24; 34) exceeds the height ($h_B$) of the connector lead (6a, 6b, 6c, 6d; 26a–26b; 36c, 36d) in the contacting region (5a, 5b, 5c, 5d; 25a–25i; 35c, 35d).

Further advantageous features of the present invention include that: (a) the carrier element (2; 21; 31) may be designed as a board with signal lines integrated therein; (b) the cover element (4; 24; 34) may be made of glass; (c) the cover element (4; 24; 34) may be adhesively mounted on the component (3a, 3b, 3c, 3d; 23a, 23b.1 23b.2, 23b.3, 23b.4, 23c; 33c, 33d); (d) the connector lead (6a, 6b, 6c, 6d; 26a–26i; 36c, 36d) may be constituted as bonding wire; (e) an encapsulant, i.e. an encapsulating material, (8) may be arranged in the contacting region (5a, 5b, 5c, 5d; 25a–25i) of the component (3a, 3b, 3c, 3d; 23a, 23b.1, 23b.2, 23b.3, 23b.4, 23c); (f) the optoelectronic component (3a, 3b, 3c, 3d; 23a, 23b.1, 23b.2, 23b.3, 23b.4, 23c; 33c, 33d) may be designed as a light source or as a detector element; (g) the cover element (4; 24; 34) may have a graduation on- the side that faces the component (3a, 3b, 3c, 3d; 23a, 23b.1, 23b.2, 23b.3, 23b.4, 23c; 33c, 33d); (h) the graduation may be designed as a transmitting or scanning graduation scale; (i) a plurality of subregions, i.e. partial regions, having graduations (7a, 7b, 7c, 7d) may be arranged on the cover element (4); (j) a plurality of optoelectronic components (23a, 23b.1, 23b.2, 23b.3, 23b.4, 23c) may be arranged on the carrier element (21) as components integrated in a flat carrier substrate (23); (k) the cover element (24) arranged over the optoelectronic components (23a, 23b.1 23b.2, 23b.3, 23b.4, 23c) may bear a fine graduation (27) at least in subregions, and a plurality of components (23b.1, 23b.2, 23b.3, 23b.4) may be designed as optoelectronic detector elements that are integrated in the carrier substrate (23); (1) the cover element (34) has a pocket-shaped recess (39c, 39d) in the contacting region (35c, 35d); and/or (m) in the edge regions adjacent to the recess (39c, 39d), the cover element (34) may rest on support elements (38a, 38b).

By applying the measures of the present invention, it is easily possible to prevent mechanical damage to the contacting regions of the detector elements or to the corresponding contacting leads. Thus, this area of the scanning unit can be reliably protected, even when working with a small scanning distance, a small distance between the scanning unit and a scale graduation scanned by it.

In one possible specific embodiment of the scanning unit according to the present invention, it is also possible to realize a very small distance between a radiation-sensitive surface region of a detector element and the required scanning graduations, so that a total system results having an altogether very compact type of construction.

Since the graduation provided in front of the particular intended component is arranged in each case on a separate covering element, this component can be manufactured independently of the carrier element or of the optoelectronic components, ie generally known precision graduation methods can be used for this purpose. On the other hand, it is not possible to pattern encapsulant with this kind of precision.

Furthermore, in another specific embodiment of the scanning unit according to the present invention, besides a graduation on the covering element, an-additional graduation of the component in question can also be provided on its radiation-sensitive or radiation-emitting surface region. It is also possible in such a variant for the components to be additionally designed as an integral component of the carrier element.

Another variant provides for configuring recesses or pockets in the vicinity of the contacting leads on the covering element side. The recesses, i.e., the remaining thickness of the covering element, in these regions are dimensionally sized to protect the contacting leads. This specific embodiment proves to be favorable for miniaturized scanning units, in particular, since an adequate bearing surface is then available for the covering element.

Of course, scanning units designed in accordance with the present invention are able to be used both in conjunction with linear measuring systems, as well as in conjunction with rotary measuring systems.

BRIEF DESCRIPTION OF THE DRAWINGS

Further advantages of, as well as details pertaining to the scanning unit of the present invention are revealed in the following description of exemplary embodiments, on the basis of the figures, in which:

FIG. 1b shows a plan view of the scanning unit of FIG. 1a;

FIG. 2b shows a plan view of the scanning unit of FIG. 2a; and

DETAILED DESCRIPTION

Figure 1A:
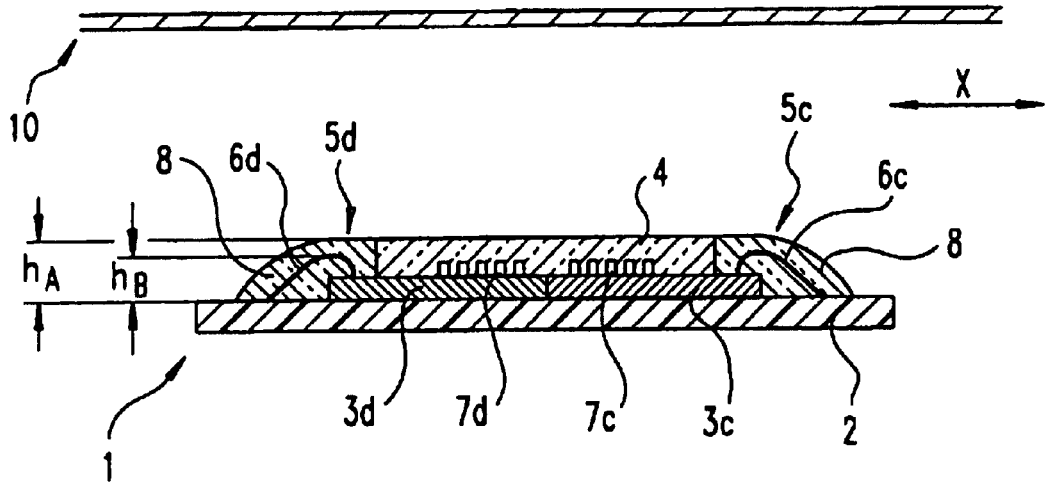
FIG. 1a shows a schematized, side sectional view of a first specific embodiment of the scanning unit according to the present invention in conjunction with a scale graduation scanned therewith.

A first specific embodiment of a scanning unit designed in accordance with the present invention is, elucidated in the following on the basis of the two FIGS. 1a and 1b. FIG. 1a shows a schematic sectional view of a scanning unit 1 according to the present invention in conjunction with a linear graduation scale 10 which bears an incremental graduation and is scanned by the scanning unit. In this exemplary embodiment, an incident-light measuring system (reflective light system) is shown, i.e., the incremental scale graduation 10 is composed in a generally known way of periodically arranged reflecting and non-reflecting regions. Of course, the measures of the present invention elucidated in the following can also be used in measuring systems of a different design, for example in code measuring systems, transmitted light measuring systems, etc. Moreover, provision can also be made, of course, for a plurality of incremental graduations arranged in parallel, i.e., reference marks on the scale, etc. Scanning unit 1 and graduation scale 10 are arranged so as to be movable in relation to one another in measuring direction, x and coupled, for example, to the tool and workpiece of a numerically controlled machine tool, when the positions of the tool and the workpiece in relation to one another need to be determined with great precision.

In this case, scanning unit 1 according to the present invention includes a carrier element 2, upon which are arranged optoelectronic components 3a, 3b, 3c, 3d designed as detector elements, used for detecting light reflected by graduation scale 10 and modulated as a function of position. Photoelements are preferably used for this purpose. Printed-circuit boards or suitable boards with printed circuit traces arranged therein are suitable for use as carrier element 2. In addition, evaluation elements may be arranged in integrated form in or on carrier element 2. A light source, preferably designed as an LED, is provided on the side of scanning unit 1.

Detector elements 3a–3d are configured with their radiation-sensitive surface regions facing away from carrier element 2, these regions are oriented in the direction of scanned graduation scale 10. Arranged directly on the radiation-sensitive surface regions of detector elements 3a–3d is, in addition, an at least semi-transparent platelike cover element 4, preferably made of glass. In this specific embodiment of scanning unit 1 of the present invention, cover element 4 is usually denoted as a scanning unit plate; Cover element 4 is dimensionally sized with respect to its planar dimensions, i.e., length 1 * width b and arranged on detector elements 3a–3b in such a way that the lateral contacting regions 5a, 5b, 5c, 5d of these components 3a–3d are not covered by cover element 4. It is thus ensured that in each case, in these contacting regions 5a–5d, at least one electrically conductive connector lead 6a, 6b, 6c, 6d can be applied, which is connected, on the other hand, to carrier element 2 or to printed circuit traces arranged thereon. Connector leads 6a–6d are conventional bonding wires, which connect components 3a–3d to the circuit traces—not shown—on carrier element 2. This enables a connection to be established with downstream evaluation elements, in which scanning signals are processed in a known manner. Evaluation elements of this kind, such as amplifier modules, interpolator modules, etc. can be arranged on carrier element 2, as well as moved spatially away therefrom.

In the depicted exemplary embodiment, cover element 4 has altogether four flat partial regions, each having a graduation 7a, 7b, 7c, 7d arranged therein. Provided here in each case as graduations 7a, 7b, 7c, 7d are periodic grating structures, which are alternately transparent or opaque (impervious) to the applied wavelength. The partial regions having graduations 7a–7d are each arranged in front of the radiation-sensitive surface regions of detector elements 3a–3d and are used, accordingly, in a well known manner as scanning gratings when optically scanning incremental graduation scale 10.

As is evident, in particular, from the sectional view in FIG. 1a, cover element 4 in this specific form is provided with a graduation on that side which directly faces the radiation-sensitive surface regions of the subjacent detector elements 3a–3d. A suitable adhesive is used in this case to secure cover element 4 to the radiation-sensitive surface regions of detector elements 3a–3d. In this context, this adhesive should be transparent to the applied wavelength and not contain any constituents which could diffuse into the underlying component.

For protection of contacting regions 5a–5d and, in particular, of electrical connector leads 6a–6d, the resulting layer thickness $h_A$, which includes the thickness of cover element 4, of the adhesive layer, as well as the thickness of detector elements 3a–3d, are selected as follows. The present invention provides for this thickness $h_A$ to be selected so that the top side of cover element 4 exceeds height $h_B$ of connector lead 6a–6d in contacting region 5a–5d, i.e., one selects $h_A > h_B$. The resulting edge structure thus ensures in a simplest manner that bonding wires 6a–6d are protected in this region from any mechanical damage caused by scale graduation 10 that is movable in relation to the bonding wires. This is also the case when merely a small (scanning) distance is provided between scanning unit 1 and graduation scale 10. In practical applications, the thickness $h_A$ to be preferably selected is about $h_A \geqq h_B + 0.1$ mm.

To still additionally protect electrical connector leads 6a–6d in the contacting region, finally provision can also be made, as in the illustrated exemplary embodiment, after cover element 4 has been placed over the radiation-sensitive surface regions of detector elements 3a–3d and the contacting has taken place, for an encapsulant 8 to be deposited in the region of the leads as shown in FIG. 1a. For this purpose, so-called "glob top" encapsulants are suitable, for instance.

Figure 1B:
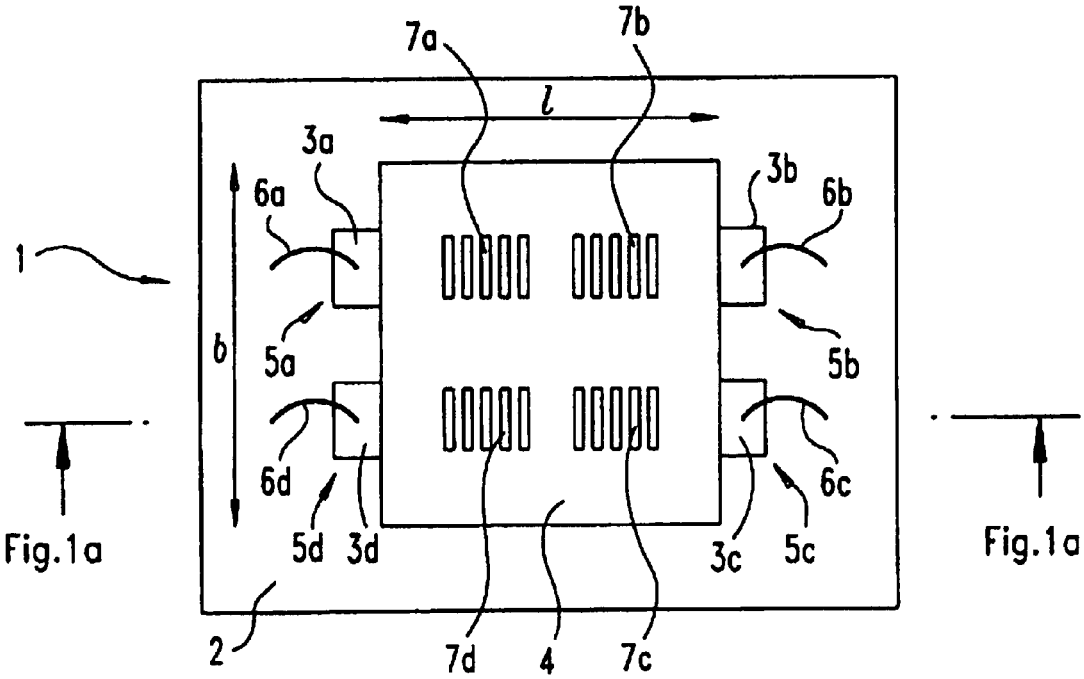

While in the illustrated exemplary embodiment of FIGS. 1a and 1b, the measures of the present invention were elucidated in conjunction with the detector elements, reference is also made at this point to the fact that identical measures can likewise be employed for other optoelectronic components in scanning units of optical position measuring systems. Thus, it is possible, for instance, at any time to protect the contacting regions from other optoelectronic components, such as light sources, in the form of LEDs, in identical fashion. In this case, a cover element can likewise be arranged in the manner described directly in front of the radiation-emitting surface regions of the LEDs. In this context, the cover element can likewise contain subregions having a graduation, which then function as a transmitting graduation scale or transmitting grating in the scanning unit. The measures of the present invention are thus able to be applied to other optoelectronic components.

Figure 2A:
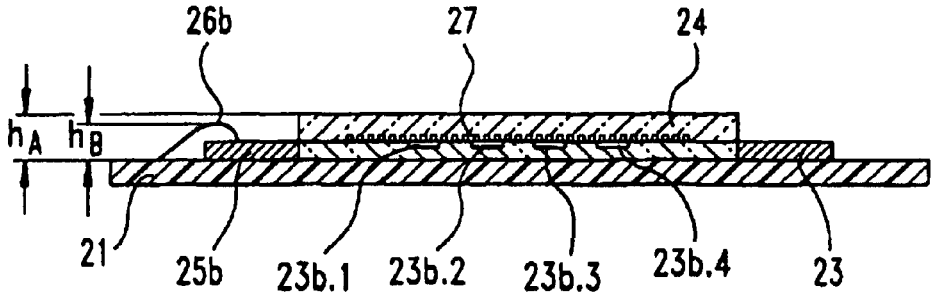
FIG. 2a shows a schematized, side sectional view of a second specific embodiment of the scanning unit according to the present invention.
Figure 2B:
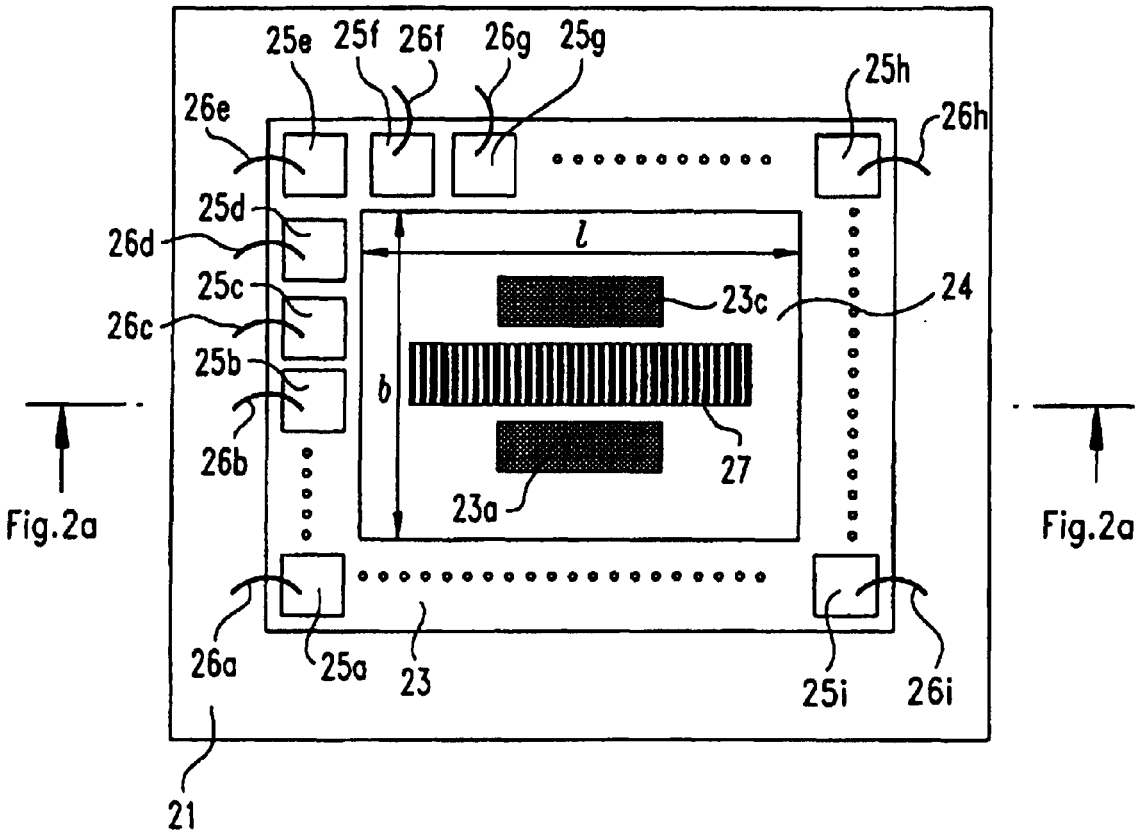

FIGS. 2a and 2b elucidate a second possible specific embodiment of the scanning unit according to the present invention. While FIG. 2a, in turn, shows a lateral, schematized sectional view, a plan view of one part of the scanning unit is shown in FIG. 2b.

In this specific embodiment, a flat carrier substrate 23 is arranged on a carrier element 21. This carrier substrate 23 is made of a semiconductor material, which includes individual subregions having different functions. Thus, for instance, individual subregions are designed as detector elements 23a, 23b.1 23b.2, 23b.3, 23b.4, 23c, whose radiation-sensitive surface regions are oriented, in turn, away from carrier element 21. Other subregions, for example, can already assume the function of evaluation components, act as integrated evaluation elements. Moreover, on its periphery, carrier substrate 23 also includes contacting regions 25a–25i, via which, in turn, an electrically conductive connection can be established in each case among detector elements 23a, 23b.1 23b.2, 23b.3, 23b.4, 23c or other components integrated in carrier substrate 23, as well as with evaluations elements arranged downstream therefrom, by way of electrical connector leads 26a–26i in the form of bonding wires.

Also arranged in this exemplary embodiment, in turn, over the radiation-sensitive surface regions of detector elements 23a, 23b.1 23b.2, 23b.3, 23b.4, 23c is a cover element 24 in the form of a glass plate having length l, width b, and thickness $h_A$. As in the preceding exemplary embodiment, cover element 24 is so configured or arranged with respect to size and placement that contacting regions 25a–25i of detector elements 23a, 23b.1 23b.2, 23b.3, 23b.4, 23c and possibly of other integrated components arranged laterally next to the radiation-sensitive surface regions, cannot be covered by them. Provision is made, in turn, at contacting regions 25a–25i for connector leads 26a–26i in the form of bonding wires, via which the electrically conductive connection of the components on carrier substrate 23 is made with downstream evaluation components.

Height $h_A$, which includes the height of cover element 24 and the height of carrier substrate 23 is selected, in turn, so that $h_A > h_B$. Provision is thus made for the top side of cover element 24 to exceed the height of connector leads 26a–26i in contacting regions 25a–25i.

In this exemplary embodiment, a graduation 27 in front of the radiation-sensitive surface region, i.e., a scanning unit graduation is merely required for the middle detector element of detector elements 23a, 23b.1 23b.2, 23b.3, 23b.4, 23c. In contrast to the exemplary embodiment elucidated above, this graduation 27 or scanning unit graduation is not arranged entirely on cover element 24; it is rather additionally provided to use a roughly graduated detector element, one that already has a rough graduation as an integral component of the radiation-sensitive surface region. For this, four detector regions 23b.1 23b.2, 23b.3, 23b.4 are provided in the illustrated example. A further graduation 27 in the form of a fine grating graduation is arranged, as in the previous exemplary embodiment, on the bottom side of cover element 24.

In principle, this exemplary embodiment can provide for arranging a suitable encapsulant in contacting regions 26a–26i as an additional protective measure.

Figure 3:
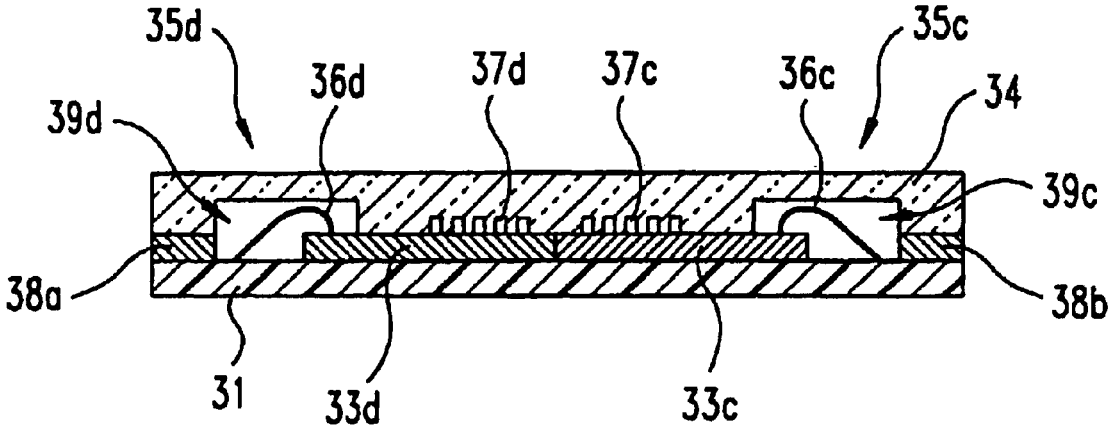
FIG. 3 shows a schematized, side sectional view of a third specific embodiment of the scanning unit according to the present invention.

A third possible specific embodiment of the scanning unit according to the present invention is elucidated on the basis of FIG. 3, which, in turn, shows a side sectional view of the same. With respect to the components, etc. this exemplary embodiment corresponds, in turn, to that of FIGS. 1a and 1b. The following will refer merely to differences from the preceding variants.

Arranged on a carrier element 31, in turn, are one or a plurality of detector elements 33c, 33d, whose radiation-sensitive surfaces are oriented away from carrier element 31. Arranged directly on, e.g., adhesively mounted on radiation-sensitive detector elements 33c, 33d is again cover element 34 in the form of a glass plate having graduations 37c, 37d. Graduations 37c, 37d function more or less, in turn, as scanning unit graduations.

To protect connector leads 36d, 36c provided in this specific embodiment for contacting detector elements 33c, 33d, cover element 34 has pocket-shaped recesses 39c, 39d in contacting regions 35c, 35d. Recesses 39c, 39d, i.e., the residual thickness of cover element 34 over recesses 39c, 39d, are dimensionally sized to facilitate problem-free placement of connector leads 36d, 36c in this region. Disposed above connector leads 36c, 36d in this specific embodiment is the thinly formed cover element 34 in the recess region. This protects contacting (connector) leads 36c, 36d, so they cannot be damaged by the-scale graduation that is movable in relation thereto. In the edge regions in question, cover element 34 rests on support elements 38a, 38b, which are arranged on carrier element 31. Recesses 39c, 39d in glass cover element 34 are able to be fabricated and dimensionally sized to achieve the desired result using an ultrasonic boring method.

Of course, the measures elucidated on the basis of the second and third exemplary embodiment can also be implemented in conjunction with other optoelectronic components, such as light sources, etc. The individual measures elucidated on the basis of the exemplary embodiments can, of course, also be combined and altered. Semi-transparent as used herein means partially transparent.

What is claimed is:

1. A scanning unit for an optical position measuring device for optically scanning a graduation of a scale to produce positionally dependent scanning signals, the scanning unit comprising:

a carrier element;

a first optoelectronic component disposed on the carrier element and having a radiation-sensitive or radiation-emitting surface region and contacting region, the surface region facing away from the carrier element;

an encapsulant arranged in the contacting region of the first optoelectronic component;

a first electrically conductive connector lead disposed between the carrier element and the contacting region, the first connector lead having a first height in the contacting region; and an at least semi-transparent cover element, the cover element having the graduation and a top side, the cover element being arranged directly on the surface region so that the contacting region is not covered by the cover element, a height of the top side exceeding the first height.

2. The scanning unit as recited in claim 1 wherein the carrier element is a board with integrated signal lines.

3. The scanning unit as recited in claim 1 wherein the cover element is made of glass.

4. The scanning unit as recited in claim 1 wherein the cover element is adhesively mounted on the first optoelectronic component.

5. The scanning unit as recited in claim 1 wherein the first connector lead is a bonding wire.

6. The scanning unit as recited in claim 1 wherein the first optoelectronic component is a light source or a detector element.

7. The scanning unit as recited in claim 1 wherein the cover element has the graduation on a side facing the first optoelectronic component.

8. The scanning unit as recited in claim 7 wherein the graduation is a transmitting or scanning graduation scale.

9. The scanning unit as recited in claim 7 wherein the graduation includes a plurality of subregions having subregion graduations.

10. The scanning unit as recited in claim 1 further comprising a second optoelectronic component disposed on the carrier element, the first and second optoelectronic components being integrated in a flat carrier substrate.

11. The scanning unit as recited in claim 10 wherein the cover element is arranged over a surface region of the second optoelectronic component, the cover element having a fine subregion graduation at least in a subregion, the first and second optoelectronic components being optoelectronic detector elements.

12. The scanning unit as recited in claim 1 wherein the cover element has a pocket-shaped recess in the contacting region.

13. The scanning unit as recited in claim 12 comprising support elements, the cover element resting on the support elements in edge regions adjacent to the recess.

14. A scanning unit for an optical position measuring device for optically scanning a graduation of a scale to produce positionally dependent scanning signals, the scanning unit comprising:

a carrier element;

a first optoelectronic component disposed on the carrier element and having a radiation-sensitive or radiation-emitting surface region and contacting region, the surface region facing away from the carrier element;

a first electrically conductive connector lead disposed between the carrier element and the contacting region, the first connector lead having a first height in the contacting region; and an at least semi-transparent cover element, the cover element having the graduation, a top side, a pocket-shaped recess in the contacting region, the cover element being arranged directly on the surface region so that the contacting region is not covered by the cover element, a height of the top side exceeding the first height[. wherein the cover element has].

15. The scanning unit as recited in claim 14 further comprising support elements, the cover element resting on the support elements in edge regions adjacent to the recess.

16. A scanning unit for an optical position measuring device for optically scanning a graduation of a scale to produce positionally dependent scanning signals, the graduation includes a plurality of subregions having subregion graduations, the scanning unit comprising:

a carrier element;

a first optoelectronic component disposed on the carrier element and having a radiation-sensitive or radiation-emitting surface region and contacting region, the surface region facing away from the carrier element;

a first electrically conductive connector lead disposed between the carrier element and the contacting region, the first connector lead having a first height in the contacting region;

an at least semi-transparent cover element, the cover element having the graduation on a side facing the first optoelectronic component, the cover element having a top side, the cover element being arranged directly on the surface region so that the contacting region is not covered by the cover element, a height of the top side exceeding the first height; and an encapsulant arranged in the contacting region of the first optoelectronic component.

17. The scanning unit as recited in claim 16 wherein the carrier element is a board with integrated signal lines.

18. The scanning unit as recited in claim 16 wherein the cover element is made of glass.

19. The scanning unit as recited in claim 16 wherein the cover element is adhesively mounted on the first optoelectronic component.

20. The scanning unit as recited in claim 16 wherein the first connector lead is a bonding wire.

21. The scanning unit as recited in claim 16 wherein the first optoelectronic component is a light source or a detector element.

22. The scanning unit as recited in claim 16 wherein the graduation is a transmitting or scanning graduation scale.

*23. A scanning unit for an optical position measuring device for optically scanning a graduation scale to produce positionally dependent scanning signals, the scanning unit comprising:*

*a carrier element;*

*a first optoelectronic component disposed on the carrier element and having a radiation-sensitive or radiation-emitting surface region and a contacting region, the surface region facing away from the carrier element;*

*an encapsulant arranged in the contacting region of the first optoelectronic component;*

*a first electrically conductive connector lead disposed between the carrier element and the contacting region, the first connector lead having a first height in the contacting region; and*

*an at least semi-transparent cover element, the cover element having a graduation and a top side, the cover element being arranged directly on the surface region so that the contacting region is not covered by the cover element, a height of the top side exceeding the first height.*

*24. The scanning unit as recited in claim 23 wherein a height of the encapsulant adjacent the cover element is substantially equal to the height of the top side.*

*25. A scanning unit for an optical position measuring device for optically scanning a graduation scale to produce positionally dependent scanning signals, the scanning unit comprising:*

*a carrier element;*

*a first optoelectronic component disposed on the carrier element and having a radiation-sensitive or radiation-emitting surface region and a contacting region, the surface region facing away from the carrier element;*

*a first electrically conductive connector lead disposed between the carrier element and the contacting region, the first connector lead having a first height in the contacting region; and*

*an at least semi-transparent cover element, the cover element having a graduation, a top side, and a pocket-shaped recess in the contacting region, the cover element being arranged directly on the surface region so that the contacting region is not covered by the cover element, a height of the top side exceeding the first height.*

*26. A scanning unit for an optical position measuring device for optically scanning a graduation scale to produce positionally dependent scanning signals, the scanning unit comprising:*

*a carrier element;*

*a first optoelectronic component disposed on the carrier element and having a radiation-sensitive or radiation-emitting surface region and a contacting region, the surface region facing away from the carrier element;*

*a first electrically conductive connector lead disposed between the carrier element and the contacting region, the first connector lead having a first height in the contacting region;*

*an at least semi-transparent cover element, the cover element having a graduation on a side facing the first optoelectronic component, the graduation including a plurality of subregions having subregion graduations, the cover element having a top side, the cover element being arranged directly on the surface region so that the contacting region is not covered by the cover element, a height of the top side exceeding the first height; and*

*an encapsulant arranged in the contacting region of the first optoelectronic component.*

*27. The scanning unit as recited in claim 26 wherein a height of the encapsulant adjacent the cover element is substantially equal to a height of the top side.*

*28. The scanning unit as recited in claim 1 wherein a height of the encapsulant adjacent the cover element is substantially equal to the height of the top side.*

*29. The scanning unit as recited in claim 16 wherein a height of the encapsulant adjacent the cover element is substantially equal to the height of the top side.*

*30. A scanning unit for an optical position measuring device for optically scanning a graduation scale to produce positionally dependent scanning signals, the scanning unit comprising:*

*a carrier element;*

*a first optoelectronic component disposed on the carrier element and having a radiation-sensitive or radiation-emitting surface region and a contacting region, the surface region facing away from the carrier element;*

*an encapsulant arranged in the contacting region of the first optoelectronic component;*

*a first electrically conductive connector lead disposed between the carrier element and the contacting region, the first connector lead having a first height in the contacting region; and*

*an at least semi-transparent cover element, the cover element having a top side, the cover element being*

*arranged directly on the surface region so that the contacting region is not covered by the cover element, a height of the top side exceeding the first height.*

*31. A scanning unit for an optical position measuring device for optically scanning a graduation scale to produce positionally dependent scanning signals, the scanning unit comprising:*

*a carrier element;*

*a first optoelectronic component disposed on the carrier element and having a radiation-sensitive or radiation-emitting surface region and at least one contacting region, the surface region facing away from the carrier element;*

*an encapsulant arranged at least in the at least one contacting region;*

*a electrically conductive connector lead disposed between the carrier element and each contacting region, each connector lead encapsulated in the encapsulant; and*

*an at least semi-transparent cover element, the cover element having a top side, the cover element arranged directly on the surface region, the cover element not covering any of the at least one contacting regions, a height of the encapsulant adjacent the cover element substantially equal to a height of the top side.*

*32. The scanning unit as recited in claim 31 wherein the carrier element is a board with integrated signal lines.*

*33. The scanning unit as recited in claim 31 wherein the cover element is made of glass.*

*34. The scanning unit as recited in claim 31 wherein the cover element is adhesively mounted on the first optoelectronic component.*

*35. The scanning unit as recited in claim 31 wherein each connector lead is a bonding wire.*

*36. The scanning unit as recited in claim 31 wherein the first optoelectronic component is a light source or a detector element.*

*37. The scanning unit as recited in claim 31 wherein the cover element has a graduation.*

*38. The scanning unit as recited in claim 37 wherein the graduation is a transmitting or scanning graduation scale.*

*39. The scanning unit as recited in claim 37 wherein the graduation includes a plurality of subregions having subregion graduations.*

*40. The scanning unit as recited in claim 31 further comprising a second optoelectronic component disposed on the carrier element, the first and second optoelectronic components integrated in a flat carrier substrate.*

*41. The scanning unit as recited in claim 40 wherein the cover element is arranged over a surface region of the second optoelectronic component, the cover element having a fine subregion graduation at least in a subregion, the first and second optoelectronic components being optoelectronic detector elements.*

*42. The scanning unit as recited in claim 31 wherein the cover element has a pocket-shaped recess in the contacting region.*

*43. The scanning unit as recited in claim 42 comprising support elements, the cover element resting on the support elements in edge regions adjacent to the recess.*

*44. The scanning unit as recited in claim 37 wherein the graduation is arranged on a side of the cover element facing the first optoelectronic component.*

*45. The scanning unit as recited in claim 37 wherein the graduation is arranged on the top side of the cover element.*

*46. The scanning unit as recited in claim 31 wherein further electronic evaluation components to process the scanning signals are arranged on the carrier element.*

*47. The scanning unit as recited in claim 46 wherein at least one further amplifier module is arranged on the carrier element.*

*48. The scanning unit as recited in claim 46 wherein at least one further interpolator module is arranged on the carrier element.*

*49. The scanning unit as recited in claim 34 wherein the cover element is adhesively mounted on the first optoelectronic component by an adhesive that is transparent to an applied wavelength.*

*50. The scanning unit as recited in claim 49 wherein the adhesive does not contain any constituents which could diffuse into an underlying component.*

*51. The scanning unit as recited in claim 39 wherein a plurality of optoelectronic detector elements are arranged on the carrier element and are covered with a single cover element, having four partial areas with subregion graduations arranged in front of radiation sensitive areas of the optoelectronic detector elements.*

*52. A scanning unit for an optical position measuring device for optically scanning a graduation scale to produce positionally dependent scanning signals, the scanning unit comprising:*

*a carrier element;*

*an optoelectronic component disposed on the carrier element and having a radiation-sensitive or radiation-emitting surface region and at least one contacting region, the surface region facing away from the carrier element;*

*an electrically conductive connector lead disposed between the carrier element and each contacting region;*

*an at least semi-transparent cover element, the cover element having a graduation, the graduation including a plurality of subregions having subregion graduations, the cover element having a top side, the cover element arranged directly on the surface region, the cover element not covering any of the at least one contacting regions; and*

*an encapsulant arranged at least in the at least one contacting region, each connector lead encapsulated in the encapsulant, a height of the encapsulant adjacent the cover element substantially equal to a height of the top side.*

*53. The scanning unit as recited in claim 52 wherein the carrier element is a board with integrated signal lines.*

*54. The scanning unit as recited in claim 52 wherein the cover element is made of glass.*

*55. The scanning unit as recited in claim 52 wherein the cover element is adhesively mounted on the optoelectronic component.*

*56. The scanning unit as recited in claim 52 wherein each connector lead is a bonding wire.*

*57. The scanning unit as recited in claim 52 wherein the optoelectronic component is a light source or a detector element.*

*58. The scanning unit as recited in claim 52 wherein the graduation is a transmitting or scanning graduation scale.*

*59. The scanning unit as recited in claim 52 wherein the graduation is arranged on a side of the cover element facing the optoelectronic component.*

*60. The scanning unit as recited in claim 52 wherein the graduation is arranged on the top side of the cover element.*

*61. A position measuring device, comprising:*

*a scale graduation; and*

*a scanning unit configured to optically scan the graduation scale to produce positionally dependent scanning signals, the scanning unit including:*

*a carrier element;*

*a first optoelectronic component disposed on the carrier element and having a radiation-sensitive or radiation-emitting surface region and at least one contacting region, the surface region facing away from the carrier element;*

*an encapsulant arranged at least in the at least one contacting region;*

*a electrically conductive connector lead disposed between the carrier element and each contacting region, each connector lead encapsulated in the encapsulant; and*

*an at least semi-transparent cover element, the cover element having a top side, the cover element arranged directly on the surface region, the cover element not covering any of the at least one contacting regions, a height of the encapsulant adjacent the cover element substantially equal to a height of the top side.*

* * * * *